(12) United States Patent
Sanchez et al.

(10) Patent No.: US 6,760,898 B1
(45) Date of Patent: Jul. 6, 2004

(54) METHOD AND SYSTEM FOR INSERTING PROBE POINTS IN FPGA-BASED SYSTEM-ON-CHIP (SOC)

(75) Inventors: Reno L. Sanchez, Albuquerque, NM (US); Douglas E. Thorpe, Albuquerque, NM (US)

(73) Assignee: Xilinx, Inc., San Jose, CA (US)

( * ) Notice: Subject to any disclaimer, the term of this patent is extended or adjusted under 35 U.S.C. 154(b) by 107 days.

(21) Appl. No.: 10/082,517

(22) Filed: Feb. 22, 2002

(51) Int. Cl.⁷ .............................................. G06F 17/50
(52) U.S. Cl. .................................. 716/16; 716/4; 716/1; 716/17
(58) Field of Search ............................. 716/16, 1–15, 716/17, 35–41, 725–741

(56) References Cited

U.S. PATENT DOCUMENTS

| | | | |
|---|---|---|---|
| 5,361,373 A | 11/1994 | Gilson | |
| 5,537,601 A | 7/1996 | Kimura et al. | |
| 5,652,904 A | 7/1997 | Trimberger | |
| 5,671,355 A | 9/1997 | Collins | |
| 5,752,035 A | 5/1998 | Trimberger | |
| 5,970,254 A | 10/1999 | Cooke et al. | |
| 6,020,755 A | 2/2000 | Andrews et al. | |
| 6,096,091 A | 8/2000 | Hartmann | |
| 6,182,247 B1 * | 1/2001 | Herrmann et al. | 714/39 |
| 6,279,045 B1 | 8/2001 | Muthujumaraswathy et al. | |
| 6,282,627 B1 | 8/2001 | Wong et al. | |
| 6,343,207 B1 | 1/2002 | Hessel et al. | |
| 6,389,558 B1 * | 5/2002 | Herrmann et al. | 714/39 |
| 6,442,725 B1 * | 8/2002 | Schipke et al. | 714/741 |
| 6,502,209 B1 * | 12/2002 | Bengtsson et al. | 714/35 |
| 6,564,347 B1 * | 5/2003 | Mates | 714/727 |
| 2001/0037477 A1 * | 11/2001 | Veenstra et al. | 714/41 |
| 2002/0194543 A1 * | 12/2002 | Veenstra et al. | 714/39 |
| 2003/0097615 A1 * | 5/2003 | Corti et al. | 714/37 |
| 2003/0110429 A1 * | 6/2003 | Bailis et al. | 714/725 |
| 2003/0110453 A1 * | 6/2003 | Bailis et al. | 716/1 |

OTHER PUBLICATIONS

U.S. patent application Ser. No. 10/082,440, Sanchez et al., filed Feb. 22, 2002.

U.S. patent application Ser. No. 10/082,441, Hwang et al., filed Feb. 22, 2002.

U.S. patent application Ser. No. 10/082,518, Hwang et al., filed Feb. 22, 2002.

Cary D. Snyder and Max Baron; "Xilinx's A–to–Z–System Platform"; Cahners Microprocessor; The Insider's Guide to Microprocessor Hardware; Microdesign Resources; Feb. 6, 2001; pp. 1–5.

* cited by examiner

*Primary Examiner*—Vuthe Siek
*Assistant Examiner*—Magid Y. Dimyan
(74) *Attorney, Agent, or Firm*—Pablo Meles (57) ABSTRACT

Probe points can be inserted (430) into an FPGA-based embedded processor SoC (305*a*) while specifying hardware and software cores with a design automation tool. This tool then aids the user (via high level GUI) in imbedding logic analysis functions in the SoC and connecting selected monitor signals to the logic analyzer. The design automation tool provides the necessary support files for the logic analysis software suite for naming and formatting of monitor signals on the waveform display. Trigger and trace information can be captured for the probe points and waveforms representing the captured information can be displayed (450) for analysis. An integrated logic analyzer core can be downloaded (440) into the FPGA-based embedded processor SoC to facilitate insertion of the probe points and capture of information. A software application can receive the captured information and translate it into a format suitable for display.

30 Claims, 4 Drawing Sheets

METHOD AND SYSTEM FOR INSERTING PROBE POINTS IN FPGA-BASED SYSTEM-ON-CHIP (SOC)

FIELD OF THE INVENTION

This invention relates generally to programmable logic devices, and more particularly to a method and system for developing and testing the functionality of an FPGA design.

BACKGROUND OF THE INVENTION

Programmable devices are a class of general-purpose integrated circuits that can be configured for a wide variety of applications. Such programmable devices have two basic versions, mask programmable devices, which are programmed only by a manufacturer, and field programmable devices, which are programmable by the end user. In addition, programmable devices can be further categorized as programmable memory devices or programmable logic devices. Programmable memory devices include programmable read only memory (PROM), erasable programmable read only memory (EPROM) and electronically erasable programmable read only memory (EEPROM). Programmable logic devices include programmable logic array (PLA) devices, programmable array logic (PAL) devices, erasable programmable logic devices (EPLD) devices, and programmable gate arrays (PISA).

As chip capacity continues to increase significantly, the use of field programmable gate arrays (FPGAs) is quickly replacing the use of application specific integrated circuits (ASICs). An ASIC is a specialized integrated circuit that is designed for a particular application and can be implemented as a specialized microprocessor. Notably, a FPGA is a programmable logic device (PLD) that has an extremely high density of electronic gates as compared to an ASIC. This high gate density has contributed immensely to the popularity of FPGAs. Notably, FPGAS can be designed using a variety of architectures that can include user configurable input/output blocks (IOBs), and programmable logic blocks having configurable interconnects and switching capability.

The advancement of computer chip technology has also resulted in the development of embedded processors and controllers. An embedded processor or controller can be a microprocessor or microcontroller circuitry that has been integrated into an electronic device as opposed to being built as a standalone module or "plugin card." Advancement of FPGA technology has led to the development of FPGA-based system-on-chips (SoC) including FPGA-based embedded processor system-on-chips. A SoC is a fully functional product having its electronic circuitry contained on a single chip. While a microprocessor chip requires ancillary hardware electronic components to process instructions, a SoC would include all required ancillary electronics. For example, a SoC for a cellular telephone can include a microprocessor, encoder, decoder, digital signal processor (DSP), RAM and ROM. It should be understood within contemplation of the present invention that an FPGA-Based SoC does not necessarily include a microprocessor or microcontroller. For example, a SoC for a cellular telephone could also include an encoder, decoder, digital signal processor (DSP), RAM and ROM that rely on an external microprocessor. It should also be understood herein that "FPGA-based embedded processor SoCs" are a specific subset of FPGA-based SoCs that would include their own processors.

In order for device manufacturers to develop FPGA-based SoCs or FPGA-based embedded processor SoCs, it is necessary for them to acquire intellectual property rights for system components and/or related technologies that are utilized to create the FPGA-based SoCs. These system components and/or technologies are called cores or Intellectual Property (IP) cores. An electronic file containing system component information can typically be used to represent the core. A device manufacturer will generally acquire several cores that are integrated to fabricate the SoC.

Notwithstanding advantages provided by using FPGA-based SoCs, the development of these SoCs can be very challenging. Although a vast proportion of cores are commercially available, a significantly greater proportion of cores are proprietary. Proprietary cores can be called customer specific cores. Commercially available cores can typically include standardized interfaces, which can provide interconnectivity between system components from various vendors. Customer specific cores can typically include proprietary interfaces that do not readily facilitate interconnectivity between system components from other vendors. For example, customer specific cores can be written in proprietary languages, which are completely different from standardized languages. Since customer specific cores do not readily facilitate interconnectivity with other vendor's system components, integrating customer specific cores during customization of an FPGA-based SoC can be time consuming. This resulted in increased development cost and greater time-to-market. Integration of the cores can include simulating, modeling and debugging the integrated cores in an operating environment. Simulation and modeling can be a daunting task since it can take hours if not days to simulate a few milliseconds of real time operation.

Importantly, verifying logic by probing the external pins has become increasingly difficult, if not impossible in certain scenarios. For example, flip-chip and ball grid array (BGA) packaging do not have exposed leads that can be physically probed using external tools such as an oscilloscope. Using traditional methods, capturing traces on devices running at system speeds in excess of 200MHz can be challenging. Furthermore, most circuit boards are small and have multiple layers with lines buried deep within layers of epoxy. These lines are inaccessible using an external tool. Notably, attaching headers to sockets or SoCs to aid in debugging can have adverse effects on system timing, especially in the case of a high-speed bus. Notably, attaching headers can consume valuable PCB real estate. The other difficulty is the fact that most functionality with the SoC is buried within the device and is not accessible via external pins. This inaccessibility leaves designers trying to debug internal logic without the ability to directly control or monitor this logic.

Given these and other inherent drawbacks, there is a need for a method and system for developing and testing the functionality of an FPGA SoC design.

SUMMARY OF THE INVENTION

The invention provides a method for automating the integration of the SoC system (as defined by an interactive processor system generator in accordance with the invention) and a SoC test and verification vehicle like Xilinx's ChipScope logic analyzer. This invention allows users to specify the inclusion of a logic analyzer as well as the desired probe points for an FPGA based SoC as well as FPGA-based Embedded Processor SoCs. These signal probing selections are input by the user via a high level GUI. As users specify what hardware and software cores they want in their FPGA-based SoC via a system generator tool, they can also specify what internal signals they want to probe with an internal logic analyzer. The ChipScope logic analyzer, for example, can be downloaded into the FPGA along with the user's SoC design to monitor internal signals. Currently, the user has to imbed the analyzer manually in the design. This is accomplished either by inserting it in the design source code (after the system generator tool has created it) or after an initial Place and Route (PAR) of the SoC design (which can greatly complicate the identification of, and access to the desired probe signals). In accordance with one aspect of the present invention, an appropriately sized logic analyzer would automatically be created and imbedded in the SoC design and the desired probe signals would be connected to the logic analyzer. In this manner, the debugging process is highly accelerated for an FPGA based SoC by making it easy for users to monitor signals. This technique provides two main advantages. The first is the aid to the user in the speedy debug of SoC designs. The second is the elimination of the need for source code by the user for the insertion of the logic analyzer which simplifies the user's job and reduces the need for disclosing source code by the core vendors.

The method can include the step of executing software code for setting up and operating a logic analyzer located within the FPGA-based SoC. The software code can be the core software code for the logic analyzer. At least one monitor probe point within the FPGA-based SoCs can be defined for analysis by the logic analyzer. Information for the monitor probe point can be collected to facilitate analysis of signals while developing and verifying the FPGA-based SoC. The collecting step can further include the step of capturing electronic signal data for the monitor probe point. The capturing step can further include the step of capturing trace information for the monitor probe point and establishing triggers than can cause collection of trigger information for monitored probe points.

The method can further include the step of integrating the software code for the logic analyzer within the FPGA-based SoCs. The software code for the logic analyzer can alternatively be downloaded into the FPGA-based embedded processor SoCs.

In a further aspect of the invention, an integrated GUI with a processor system generator tool for development and verification of an FPGA-based embedded processor SoC is provided. The GUI can include a selection dialog for defining and selecting monitor probe points. The processor system generator tool would provide the necessary control/inputs/files to an integrated logic analyzer (ILA) setup as well as control software to minimize user work.

A prime example would be an output file that tells the logic analyzer what the signal set is, what triggers to set, and how to display it on a waveform window within a GUI display window. The selection dialog can further include an object for establishing trigger signals and conditions and/or an object for establishing trace parameters for the monitor probe points. The selection dialog can facilitate presentation of a selection attribute including, but not limited to, a target device family, a clock edge, a trigger type, a trigger match unit type, a number of trigger match units, a data depth, a data width, and a trigger width.

DETAILED DESCRIPTION OF THE DRAWINGS

Figure 1:
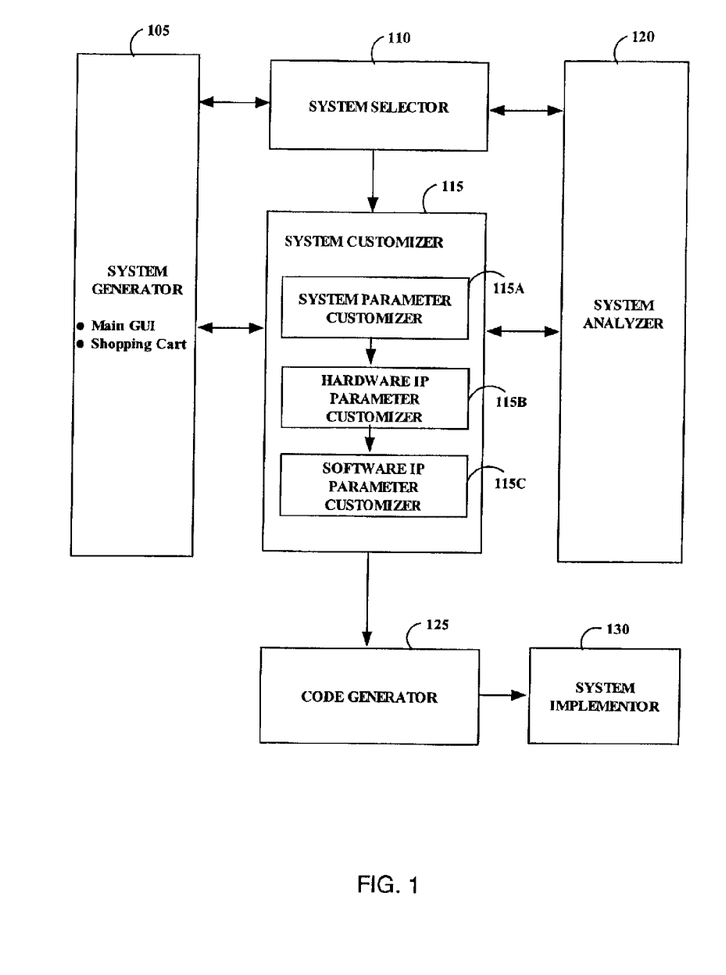
FIG. 1 is a block diagram of a processor system generator in accordance with the invention.

Referring to FIG. 1, there is shown a block diagram illustrating an exemplary system for developing and verifying a FPGA-based SoC in accordance with the invention. For illustrative purposes, and without limiting the scope of the invention, an embedded system consisting of a microprocessor, buses, memory architecture, peripherals, and software components is presented, although a system using an external microprocessor is certainly contemplated within the scope of the invention. Exemplary software components for the embedded system can include, but is not limited to, device drivers and system software, such as a real time operating system (RTOS) and protocol stacks. An exemplary development environment for this embedded system can include, but is not limited to, one or more libraries for microprocessors, peripherals, system software, and device drivers. The relevant bus architectures and memory options that can be utilized for the development of an FPGA-based SoC can be included in the libraries. Further, a good example of hardware/software function tradeoff can involve the protocol stack, which can be implemented in either hardware or software. A user may implement a protocol stack in software if there is sufficient processing power to meet all performance requirements or the user could implement the protocol stack in hardware given sufficient FPGA resources and a presumed need for higher performance.

In general, a system model can be created to facilitate design and testing of an FPGA-based SoC. The system model can include a data structure that represents the internal structure and functionality of the FPGA-based SoC. The system model can include, but is not limited to, system components, interconnections between components, and attributes, which define various characteristics and functionality of the system components and interconnections. The data structure can be a hierarchical structure, for example a tree structure, which can mirror the design hierarchy of the embedded system. This system model can also include algorithms, which can facilitate selection and customization of system components. Notably, the system model can be part of an integrated object-oriented system (OOS) that can facilitate selection and customization of the system components. Alternatively, other mechanisms and algorithms external to the system model can facilitate selection and customization of the system components.

Referring now to FIG. 1, there are shown a platform generator 105, a system selector 110, a system customizer 115, a system analyzer 120, a code generator 125, and a system implementor 130 all forming a processor system generator. The platform generator 105 can include one or more GUIs that can facilitate design of the system model. A main GUI can provide various system options and informational dialogs. The platform generator can include, a navigator GUI having one or more dialogs and/or objects, a topological GUI having one or more dialogs and/or objects and a selection customizer GUI having one or more dialogs and/or objects. One or more dialogs and/or objects can provide system component resource counts, performance estimates, power requirements and system and application software requirements. For example, a GUI can be used to display a table or chart representing the resource allocation for the system components. Advantageously, such table or chart can provide an easily readable condensed view of the system resource allocation. An exemplary table is illustrated below.

| Device | LUTs | DFFs | Slices | BRAM | I/Os |
|---|---|---|---|---|---|
| OPB Arbiter | 300 | 200 | 200 | 0 | 9 |
| UART 16450 | 500 | 400 | 300 | 0 | 12 |
| Ethernet 10/100M | 2500 | 1700 | 1500 | 0 | 12 |
| Total Utilized | 3300 | 2300 | 2000 | 0 | 21 |
| Device Resources | 122880 | 122880 | 61440 | 3456 | 1488 |
| Available Resources | 119580 | 120580 | 59440 | 3456 | 1267 |

Referring to the table, a condensed view of the system resources is provided. Specifically, the table shows a breakdown of particular resources utilized by each device and also the total resources utilized by all devices. The available resources can be computed based on the total utilized resources and the total device resources. For example, there are 122880 D-flip flops (D-FFs) available. OPB arbiter utilizes 200 D-FFs, UART 16450 utilizes 400 D-FFs, and Ethernet 10/100M device utilizes 1700 D-FFs. Hence, there are 2300 D-FFs utilized, which leaves 120580 available.

The navigator dialog and/or object can provide an interactive interface that can facilitate viewing of design specification and configuration information. For example, one or more navigator objects can provide a graphical view to facilitate the insertion of a microprocessor from a library into the system model. In a case where a universal asynchronous receiver/transmitter (UART) is selected as a peripheral, the navigator object and/or dialog can permit customization of the UART. The navigator dialog can also be configured to permit switching between multiple design and implementation tasks. The topological dialog can utilize a block diagram format to provide a topological view that can visually represent the existing state of the system model. The selection customizer object can permit the selection and customization of a system component. Upon selection of a system component, a GUI which can include a dialog and can facilitate customization of the system component. Platform generator 105 can have the capability to permit a particular state and/or stage of the system design and implementation to be saved and recalled at a subsequent time.

System selector 110 can be a GUI that can facilitate selection of the system components that can be used to design the FPGA-based SoC. For example, the system selector 110 can provide one or more dialogs that can permit the selection of microprocessors, microcontrollers, peripheral devices, buses, system software and application software. During selection of system components, each of the selected components can be independently treated.

The system customizer 115 can include one or more GUIs having objects and/or dialogs that can facilitate customization or configuration of system components and software. Referring to FIG. 1, there are shown a system parameter customizer 115a, a hardware intellectual property (IP) parameter customizer 115b, and a software IP parameter customizer 115c. The system parameter customizer 115a can facilitate customization of the memory map, interrupt bindings and priorities, and global and default system parameter definitions. The hardware intellectual property (IP) parameter customizer 115b can facilitate customization of device specific parameters. For example, data bus widths, IP interfaces and device specific parameters can be customized by hardware intellectual property (IP) parameter customizer 115b.

The software intellectual property (IP) parameter customizer 115c can facilitate customization of software specific parameters. For example, upon selection of a system component or a peripheral, an interrupt request (IRQ) number, a memory mapped I/O address and default initialization parameters can be assigned to the peripheral by the software IP parameter customizer 115c. In a case where a UART has been selected as a peripheral, default parameters can include, but are not limited to, stop bits, parity designation on/off, and baud rate. The customizer system 115 not only provides selection of the system components, but can also be configured to bind system parameters to system components. For example, the memory map for a particular peripheral can be bound to the peripheral giving the peripheral its unique memory address space. Furthermore, a GUI having one or more dialogs can be used to populate a system model data structure with customization parameters and/or attributes.

The system analyzer 120 can include one or more GUIs having objects and/or dialogs that can provide immediate feedback regarding architectural choices made during customization. The system analyzer 120 can include software that can have the capability to validate and analyze the system model while it is being customized. If problems including, incompatibilities, conflicts and/or system violations occur, the system analyzer 120 can issue immediate warnings and/or provide possible solutions. The system analyzer 120 can perform tasks such as system checks, parameter consistency checks, data type and value propagation checks, interconnection inference, and resource and performance analysis. Interconnection reference pertains to implications that can result from making certain connections. The system analyzer 120 can also assign device identifications (IDs) to system components and computing configuration read-only-memory (ROM) data. Exemplary system and parameter consistency checks can include, matching data bus widths of peripherals and system components, determining interrupt conflicts, determining memory map conflicts, determining memory size and usage, determining device counts, determining availability of FPGA resources and determining maximum operating frequency.

The system analyzer 120 can be configured to propagate default values, global values and/or previously defined values through the system model. For example, if a bus is configured with a default data width of 16 bits, then each peripheral that "sits on" or utilizes that bus can automatically be configured with a data width of 16 bits. It should be recognized by one skilled in the art that although a peripheral device may be automatically configured with the default bus width value, this value can be overwritten. For example, depending on the application, availability of certain devices can dictate that two (2) 8-bit devices be utilized instead of a single 16-bit device. Advantageously, the propagation of values can prevent multiple entries of similar data which typically increases development time.

During performance analysis, system analyzer 120 can have the capability to determine if system components are properly configured. For example, system analyzer 120 can identify a high-speed device that has not been configured with direct memory access (DMA). Since such a device can invariably cause a system conflict, system analyzer can consider it as a source of potential problem. System analyzer 120 can also determine whether there are too many devices residing on a bus based on the device count. For example, the system analyzer 120 can have the capability to determine whether there are too many high-speed devices on a low speed bus. In this case, the system analyzer 120 can indicate the possibility of errors and/or generate possible solutions. By tracking memory usage, the system analyzer 120 can have the capability to determine whether the code space assigned in the memory map is too large for the physical memory. System analyzer 120 can also be configured to track physical resource requirements for example, slice counts for IP blocks, and width and height of specifications of IP blocks. A GUI can provide a visual display of a resulting or representative floor plan to aid with tracking and management of physical resources.

Code generator 125 can include one or more GUIs having objects and/or dialogs that can facilitate generation of the code necessary for implementing the design of the FPGA-based embedded processor SoC or FPGA-based SoC. The code necessary for implementing the design of the FPGA-based embedded processor SoC can be in a format such as the well known hardware description language (HDL). HDL is a language used to describe the functions of an electronic circuit for documentation, simulation and/or logic synthesis. Verilog and VHSIC Hardware Description Language (VHDL) are standardized HDLs which are well known by those skilled in the art. Verilog and VHDL can be used to design electronic systems at the component, board and system level. They can facilitate the development of models at a very high level of abstraction. Other formats now known or to be discovered can also be used to represent the system model.

Depending on information generated by, for example, the software IP parameter customizer 115c, the code generator 125 can tailor "header files, " which can be used to implement the software IP of the FPGA-based SoC. Moreover, depending on the selected software IP, processors, .peripherals, operating system and device drivers, code generator 125 can produce a source code directory structure that can facilitate implementation of the software IP of the FPGA-based SoC. The code generator 125 can also generate the necessary "make files," which can be used to define the rules necessary for compiling and building the code used to implement the software IP of the FPGA-based SoC. The code generator 125 can be configured to generate information that can be used for debugging. The generated information can be in an ASCII format or other suitable format and can include information such as the memory map, the configuration ROM table and the peripheral ID map.

The system implementor 130, can include one or more GUIs that can have objects and/or dialogs that can facilitate implementation of the FPGA-based SoC design. Implementation of the design can include, but is not limited to, HDL simulation and synthesis, mapping of information generated by the code generator 125, placement, routing and bitstream generation. An integrated tool or separate tools can facilitate the implementation of the FPGA-based SoC design.

Figure 2:
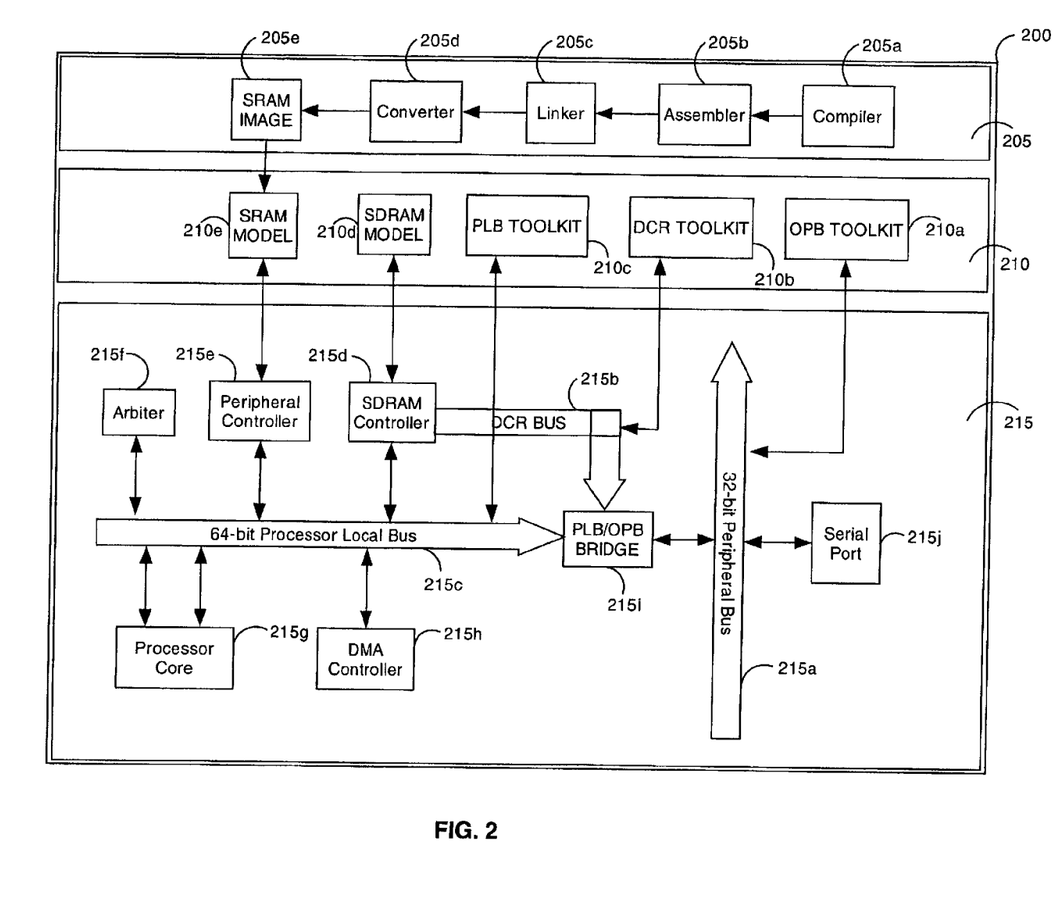
FIG. 2 depicts an exemplary topological view of the system model in accordance with the inventive arrangements.

FIG. 2 depicts an exemplary topological view of the system model in accordance with the inventive arrangements. A GUI 200 can facilitate display of the topological view of the system model; GUI 200 can include a software development window 205, a simulation model window 210 and a core model window 215. The software development window 205 can include one or more objects representing the various tools that can be used to create the code for the model system. Software development window 205 can include a compiler object 205a, an assembler object 205b, a linker object 205c, a converter or formatter object 205d and a SRAM object 205e. Software build tools such as compilers, assemblers, linkers, and converters are well known by those skilled in the art. Simulation model window 210 can include an OPB toolkit object 210a, a DCR toolkit object 210b, a PLB toolkit object 210c, an SRAM model object 210d and a SRAM model object 210e.

The core model window 215 can include objects representing the system components that comprise the system model. Core model window 215 contains a 32-bit peripheral bus 215a, a DCR bus 215b, a 64-bit processor local bus 215c, a SDRAM controller 215d, a peripheral controller 215e, an arbiter 215f, a processor core 215g, a DMA controller 215h, a PLB/OPB bridge 215i and a serial port 215j. A high level view of the interconnections between the system components is shown in the core model window 215. For example, PLB/OPB bridge 215i provides interconnections between buses 215a, 215b and 215c. Bus 215c facilitates communication between peripherals including arbiter 215f, peripheral controller 215e, SDRAM controller 215d, DMA controller 215h and processor core 215g. Arrows between the objects in the core model window 215 and the simulation model window 210 can illustrate a relationship between corresponding objects in each model window.

Figure 3:
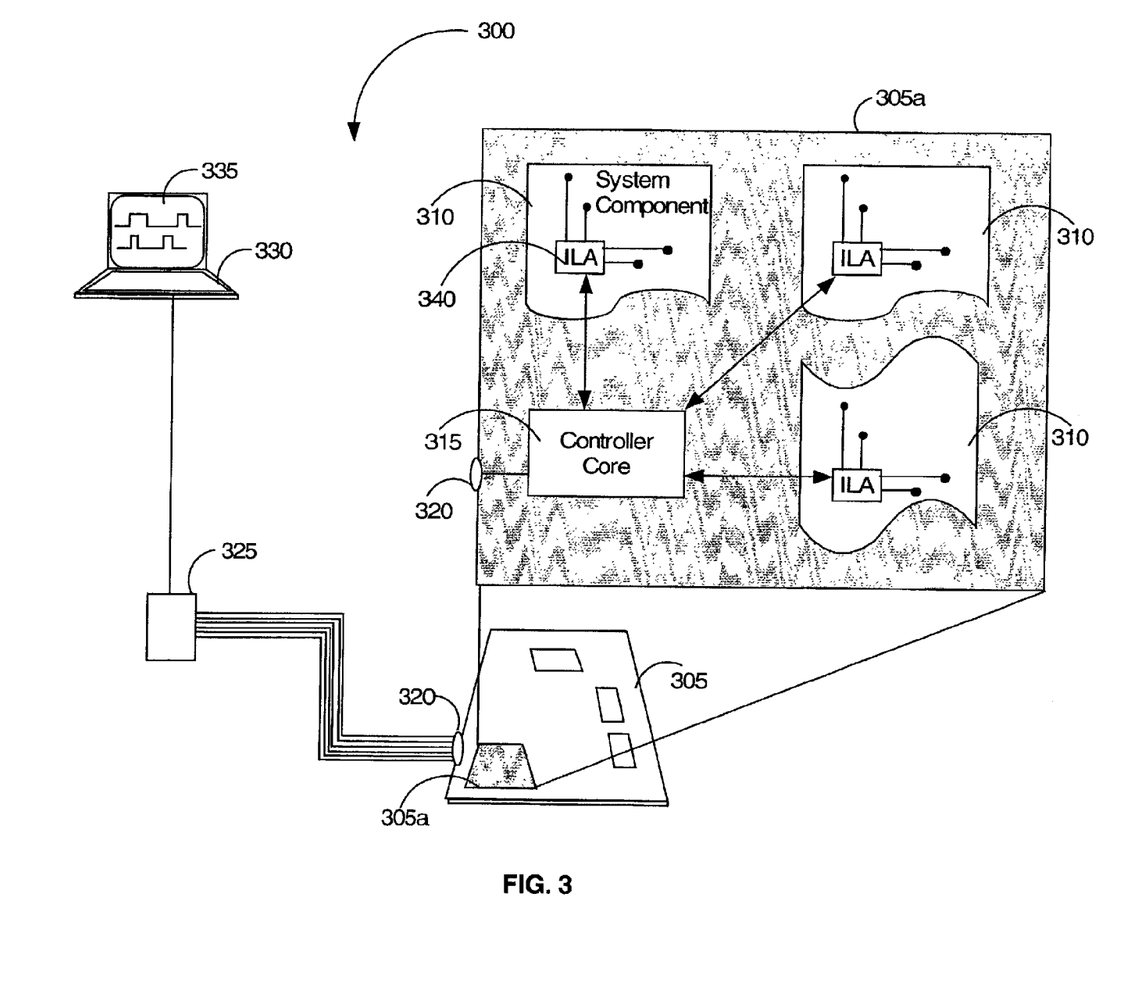
FIG. 3 depicts and exemplary integrated internal logic analyzer in accordance with the invention.

FIG. 3 depicts an exemplary integrated logic analyzer (ILA) system 300 in accordance with the invention. The system can include a target board 305 having system components having various electronic components including an FPGA-based embedded processor SoC 305a. The target board 305 can include a debug port 320 that can facilitate access to signals on the target board 305 including FPGA-based embedded processor SoC for debugging purposes. Exemplary debug ports such as BDM and JTAG are well known in the art. A communication interface 325 can provide signal conversion between the debug port 320 and a computer 330. Computer 330 can include a display 335 for displaying waveform for captured traces and triggers.

The FPGA-based embedded processor SoC 305a can have an ILA core 340 within each system component 310, and an integrated controller core 315. The ILA core 340 and the integrated controller core 315 can be software based. The ILA core 340 can be integrated into the PGA-based embedded processor SoC 305a and can provide access to every internal node and the complete data bus at full system speed. The integrated controller core 315 receives trigger and trace capture data from the ILA core 340 and communicates the received data to the computer 330 through the debug port 320. The communication interface receives data signals from the integrated controller core 315 and converts the received data into a format interpretable by computer 330.

A software application running on computer 330 can permit the selection of hardware and software cores for the system model. The software application can include a GUI with one or more dialogs that can permit identification and setup of probe points that are to be monitored. Triggers can be established for collecting trigger and trace information for the probe points. Information for the probe points, trace and trigger can be downloaded into FPGA-based SoC using the software application. The software application running on computer 330 can receive, translate and display trigger and trace waveform in a display window on the display 335.

Figure 4:
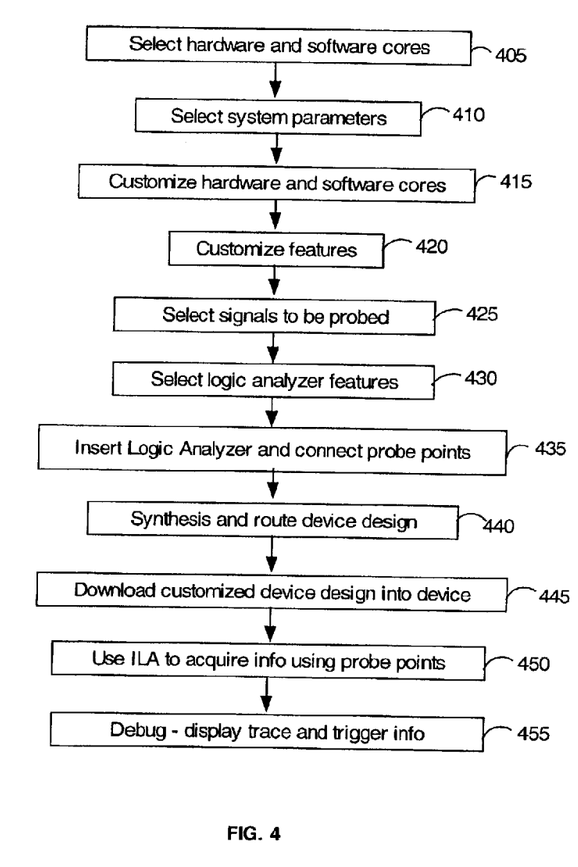
FIG. 4 is a flowchart depicting exemplary steps for inserting probe points in a FPGA-based embedded processor Soc.

FIG. 4 is a flowchart depicting exemplary steps for inserting probe points in an FPGA-based embedded processor SoC. Referring to FIG. 4, in step 405, the hardware and software IP cores are selected. In step 410, the system parameters can be selected. In step 415, the hardware and software cores can be customized. In step 420, any specialized features can be customized. In step 425, the signals that are to be monitored or probed can be selected. In step 430, the user selects the desired features of the Logic Analyzer based on the previously selected monitor signals. In step 435, the logic analyzer can be inserted and connected to the selected monitor signals by the system generator 105 of FIG. 1. In step 440, the FPGA-based embedded processor SoC device design can be synthesized and routed. In step 445, the customized FPGA-based embedded processor SoC design is downloaded into the FPGA. In step 450, the integrated logic analyzer can be used to acquire information using the probe points. In step 455, a software application can acquire information for the probe points from the ILA and display trigger and trace information. The logic analyzer application will use files generated in step 430 and 435 to configure the basic function of the logic analyzer and to provide naming and format information of the monitor signals displayed on the waveform window. To acquire information, a bitstream can be downloaded to the FPGA-based embedded processor SoC device and the display trigger and trace information acquired.

Advantageously, the ability to insert breakpoints to fully test an FPGA-based embedded processor SoC can save a tremendous amount of time development and integration time. Notably, the invention permits first hand monitoring and analysis of conditions within the FPGA-based embedded processor SoC device. This eliminates any need to monitor external signals and deduce what is occurring within the device based on externally monitored signals.

In light of the foregoing description of the invention, it should be recognized that the present invention could be realized in hardware, software, or a combination of hardware and software. A method and system for inserting probe points in an FPGA-based SoC according to the present invention can be realized in a centralized fashion in one computer system, or in a distributed fashion where different elements are spread across several interconnected computer systems. Any kind of computer system, or other apparatus adapted for carrying out the methods described herein, is suited. A typical combination of hardware and software could be a general-purpose computer system with a computer program that, when being loaded and executed, controls the computer system such that it carries out the methods described herein.

The present invention can also be embedded in a computer program product, which comprises all the features enabling the implementation of the methods described herein, and which, when loaded in a computer system, is able to carry out these methods. Computer program or application in the present context means any expression, in any language, code or notation, of a set of instructions intended to cause a system having an information processing capability to perform a particular function either directly or after either or both of the following a) conversion to another language, code or notation; b) reproduction in a different material form.

Additionally, the description above is intended by way of example only and is not intended to limit the present invention in any way, except as set forth in the following claims.

What is claimed is:

1. A method for developing and verifying a FPGA-based SoC, the method comprising:
   executing software code for a logic analyzer located within the FPGA-based SoC, said software code being the core software code for said logic analyzer;
   defining at least one monitor probe point within the FPGA-based SoC for analysis by said logic analyzer, wherein the software code includes at least one trigger subject to control by a processor included within said FPGA-based SoC for the at least one monitor probe point during customization of said FPGA-based SoC; and
   collecting information for said at least one monitor probe point to facilitate analysis of signals while developing and verifying the FPGA-based SoC.

2. The method according to claim 1, wherein said collecting step further comprises the step of capturing electronic signal data for said monitor probe point.

3. The method according to claim 2, wherein said capturing step further comprises the step of capturing trace information for said monitor probe point.

4. The method according to claim 2, wherein said capturing step further comprises the step of establishing triggers for causing the collection of trigger information for said monitor probe point.

5. The method according to claim 1, further comprising the step of receiving said collected information for said monitor probe point by an external monitor tool comprising an interface for communicating with said logic analyzer located within the FPGA-based SoC.

6. The method according to claim 5, further comprising the step of translating said collected information into a waveform representing trigger and trace capture.

7. The method according to claim 6, wherein said translating step further comprises the step of displaying said waveform of said trigger and said trace capture on a display for said monitoring tool.

8. The method according to claim 1, wherein said monitor probe point is selected from the group consisting of an internal node of the FPGA-based SoC, a device pin and/or a data bus line of the FPGA-based SoC.

9. The method according to claim 1, further comprising the step of integrating said software code for said logic analyzer within said FPGA-based SoC.

10. The method according to claim 1, further comprising the step of downloading said software code for said logic analyzer to said FPGA-based SoC.

11. A machine readable storage having stored thereon, a computer program having a plurality of code sections, said code sections executable by a machine for causing the machine to perform the steps of:
   executing software code for a logic analyzer located within an FPGA-based SoC, said software code being the core software code for said logic analyzer utilized for developing and verifying said FPGA-based SoC;
   defining at least one monitor probe point and at least one trigger for said FPGA-based SoC for analysis by said logic analyzer, said FPGA-based SoC including a processor, wherein said at least one trigger is monitored with said logic analyzer and subject to control by said processor for acquisition of trigger information— during customization of said FPGA-based SoC; and
   collecting information for said at least one monitor probe point to facilitate analysis of signals while developing and verifying said FPGA-based SoC.

12. The machine readable storage according to claim 11, wherein said collecting step further comprises the step of capturing electronic signal data for said monitor probe point.

13. The machine readable storage according to claim 12, wherein said capturing step further comprises the step of capturing trace information for said monitor probe point.

14. The machine readable storage readable storage according to claim 12, wherein said capturing step further comprises the step of establishing triggers for causing the collection of trigger information for said monitor probe point.

15. The machine readable storage according to claim 11, further comprising the step of receiving said collected information for said monitor probe point by an external monitor tool comprising an interface for communicating with said logic analyzer located within said FPGA-based SoC.

16. The machine readable storage according to claim 15, further comprising the step of translating said collected information into a waveform representing trigger and trace capture.

17. The machine readable storage according to claim 16, wherein said translating step further comprises the step of displaying said waveform of said trigger and said trace capture on a display for said monitoring tool.

18. The machine readable storage according to claim 11, wherein said monitor probe point is selected from the group consisting of an internal node of said FPGA-based SoC, a device pin and/or a data bus line of said FPGA-based embedded processor SoC.

19. The machine readable storage according to claim 11, further comprising the step of integrating said software code for said logic analyzer within said FPGA-based SoC.

20. The machine readable storage according to claim 11, further comprising the step of downloading said software code for said logic analyzer to said FPGA-based SoC.

21. A FPGA-based SoC development and verification system, the system comprising:

a software core for a logic analyzer inserted within an FPGA-based SoC during customization of the FPGA-based SoC, the FPGA-based SoC including a processor for carrying out instruction of the software core for control of one or more triggers;

an external software monitor tool having an interface for communicating with said logic analyzer software core; and a communication port for facilitating exchange of data between said logic analyzer software core and said external monitor tool.

22. The FPGA-based SoC development and verification system according to claim 21, further comprising a controller integrated within the FPGA-based SoC for facilitating the communication of information between said logic analyzer software core and said communication port.

23. The FPGA-based SoC development and verification system according to claim 21, wherein said external software monitor tool further comprises a graphical user interface (GUI) for selecting and modifying trigger and setup functions and for displaying waveforms for trace and captured information.

24. A GUI for development and verification of a FPGA-based SoC, the GUI comprising:

a selection dialog for defining and selecting monitor probe points and for defining triggers subject to control by a processor of the FPGA-based SoC;

a display window for displaying waveforms for trace and trigger conditions; and a communication interface for facilitating communication with a logic analyzer core integrated within the FPGA-based SoC.

25. The GUI according to claim 24, wherein said selection dialog further comprises an object for establishing a trigger condition.

26. The GUI according to claim 24, wherein said selection dialog further comprises contains objects for establishing trace parameters for said monitor probe points.

27. The GUI according to claim 24, wherein said selection dialog presents a selection attribute selected from the group consisting of target device family, clock edge, trigger type, trigger match unit type, number of trigger match units, data depth, data width, and trigger width.

28. A method for developing and verifying a FPGA-based SoC within a system, the method comprising:

executing software code for a logic analyzer located within the FPGA-based SoC, the software code being the core software code for the logic analyzer;

defining at least one monitor probe point and at least one trigger for the FPGA-based SoC for analysis by the logic analyzer, wherein the software code, the at least one monitor probe point, and the at least one trigger defined are created during customization of the FPGA-based SoC, the at least one trigger subject to control by a processor of the FPGA-based SoC; and collecting information for the at least one monitor probe point to facilitate analysis of signals within the system while developing and verifying the FPGA-based SoC.

29. A machine readable storage having stored thereon, a computer program having a plurality of code sections, the code sections executable by a machine for causing the machine to perform the steps of:

executing software code for a logic analyzer located within an FPGA-based SoC portion of a system, the software code being the core software code for the logic analyzer utilized for developing and verifying the FPGA-based SoC;

defining at least one monitor probe point and at least one trigger for the FPGA-based SoC for analysis by the logic analyzer, wherein the software code, the at least one monitor probe point, and the at least one trigger defined are created during customization of the FPGA-based SoC, the at least one trigger subject to control by a processor of the FPGA-based SoC; and collecting information for the at least one monitor probe point to facilitate analysis of signals within the system while developing and verifying the FPGA-based SoC.

30. A GUI for development and verification of a system including an FPGA-based SoC, the GUI comprising:

a selection dialog for defining and selecting monitor probe points and at least one trigger for the system, the monitor probe points being located within the FPGA-based SoC, the at least one trigger subject to control by a processor of the FPGA-based SoC;

a display window for displaying waveforms for trace and trigger conditions; and a communication interface for facilitating communication with a logic analyzer core integrated within the FPGA-based SoC.

* * * * *